United States Patent

Sah

[11] Patent Number: 6,104,042
[45] Date of Patent: Aug. 15, 2000

[54] THIN FILM TRANSISTOR WITH A MULTI-METAL STRUCTURE A METHOD OF MANUFACTURING THE SAME

[75] Inventor: Wen-Jyh Sah, Jen Te, Taiwan

[73] Assignee: Chi Mei Optoelectronics Corp., Hsinchu, Taiwan

[21] Appl. No.: 09/328,580

[22] Filed: Jun. 10, 1999

[51] Int. Cl.[7] .......................... H01L 29/04; H01L 31/036
[52] U.S. Cl. .................................. 257/59; 257/66; 257/72
[58] Field of Search .................. 257/59, 72, 66, 257/61, 57, 58, 60, 462, 459

[56] References Cited

U.S. PATENT DOCUMENTS

| | | | |
|---|---|---|---|
| 5,362,660 | 11/1994 | Kwasnick et al. | 437/40 |
| 5,498,573 | 3/1996 | Whetten | 437/192 |
| 5,867,242 | 2/1999 | Yao et al. | 349/122 |
| 5,905,274 | 5/1999 | Ahn et al. | 257/59 |
| 5,920,082 | 7/1999 | Kitazawa et al. | 257/59 |
| 5,942,767 | 8/1999 | Na et al. | 257/59 |
| 5,976,902 | 11/1999 | Shih | 438/30 |
| 5,981,972 | 11/1999 | Kawai et al. | 257/59 |
| 6,011,274 | 1/2000 | Gu et al. | 257/59 |

FOREIGN PATENT DOCUMENTS

| | | | |
|---|---|---|---|
| 2-219275 | 8/1990 | Japan | 257/66 |
| 2-224275 | 9/1990 | Japan | 257/61 |
| 3-44968 | 2/1991 | Japan | 257/61 |
| 6-85255 | 3/1994 | Japan | 257/72 |

Primary Examiner—Donald L. Monin, Jr.

[57] ABSTRACT

The present invention includes forming a gate on a transparent substrate. A gate isolation layer is then formed on the gate. An amorphous silicon (a-Si) layer and n+ doped silicon layer are successively formed on the gate isolation layer. Then, the a-Si layer and the n+ doped silicon layer are patterned. A first, a second and a third metal layers are successively formed on the n+ doped silicon layer, thereby forming a multi-metal layer structure. Subsequently, a wet and a dry etching is utilized to etch the multi-metal layer, thereby defining the S/D electrodes. A passivation layer is deposited on the S/D structure.

26 Claims, 9 Drawing Sheets

THIN FILM TRANSISTOR WITH A MULTI-METAL STRUCTURE A METHOD OF MANUFACTURING THE SAME

CROSS REFERENCE TO RELATED APPLICATION

This application is related to a application Ser. No. 09/321,210 filed on May 27, 1999.

FIELD OF THE INVENTION

The present invention relates to a method of making a thin film transistor (TFT) for a liquid crystal display (LCD), and more specifically, to a method of forming a TFT with a multi-metal structure as source and drain electrodes.

BACKGROUND OF THE INVENTION

There are various kind of flat panel display devices characterized by low power consumption and small size. Those devices include the liquid crystal display (LCD), plasma display panel (PDP) and electroluminescence display (ELD). The LCD has been used in electron devices successfully because of its capability for high resolution. At present, the portable computer or personal data assistant (PDA) are widely used in the mass market and those are remarkably progressing. In order to meet the requirement of portable apparatus, the displays for portable use are light weight and low power consumption. Thin film transistor-liquid crystal display (TFT-LCD) is one of the devices that can fit the aforementioned requirements and is known as the display required for the high pixel density and quality.

In general, the TFT-LCD includes a bottom plate formed with thin film transistors and pixel electrodes and a top plate formed with color filters. The liquid crystal is filled between the top plate and the bottom plate. In each unit pixel, the TFT serves as a switching element of the unit pixel. When the data voltage is applied to the TFT, the arrangement of the liquid crystal molecules is changed, thereby changing the optical properties and displaying the image. The color filter (CF) plate is used in the LCD to show the colored portion of the screen.

In the art, two types of the TFT structure are developed. One is the so called ES (etching stopper) TFT and the other one is the BCE (bask channel etched) TFT. In the type of BCE TFT, there is no etching block on the channel region, therefore, the channel region will be etched during the process because of the etching rates of the amorphous silicon and the doped silicon are similar. Please refer to FIG. 2, a gate electrode 22 is formed on the substrate 20. An insulating layer 24 is next formed on the gate electrode 22. An amorphous silicon layer 26 having a channel loss region 26a is over the insulating layer 24. The amorphous layer 26 has a doped silicon layer 28 formed on a portion of the amorphous silicon layer 26 for forming ohmic contact. Source and drain (S/D) electrodes consisting of a Cr 29a sub-layer and an Al sub-layer 29b are patterned on the doped silicon layer 28. The disadvantage of the BCE type structure is that the channel region will lose thickness during the etching for forming the S/D electrodes. In addition, the wet etching to etch the double metal (Al/Cr) layers generates undercut portions 29c under the Al sub-layer 29b due to the etching rate of the two sub-layers is different and the solution will laterally etch the Cr layer. It is hard to control the etching conditions to prevent the channel from being etched and forming the undercut portions 29c.

Referring to FIG. 3, in the type of the ES TFT structure, an etching stop layer is formed over an amorphous silicon layer to prevent the channel region formed in the amorphous silicon layer from being etched while an etch is performed to form the source and drain. The ES type is shown in FIG. 3, the structure includes a substrate 32, a gate electrode 34 is formed on the substrate. An insulating layer 36 is formed on the gate electrode 34 for isolation. An amorphous silicon layer 38 is patterned on the isolation layer 36. Reference number 42 is the aforementioned etching stopper 42 to protect the channel region. Thus, it has high resistant to etch. Source and drain (S/D) electrodes 44 are formed on the amorphous silicon layer 38 and a portion of the etching stopper 42. Typically, the S/D electrodes 44 are consisted of multi-metal layers, which are n+ doped silicon layer 44a, a first titanium layer 44b, an aluminum layer 44c and a further titanium layer 44d. The n+ doped silicon layer 44a is used to form ohmic contact layer. In the structure, a portion of the ES layer 42 is exposed by the S/D electrodes 44. The channel region under the ES layer 42 will not be attacked during the etching to form S/D electrodes 44. However, the channel length of the ES type TFT is longer than BCE type TFT structure.

As the display resolution is going higher and higher, the performance of the TFT is also pushed higher and higher. From the device performance point of view, the BCE type TFT has the advantage of shorter channel length. Considering the channel loss, wet etch of the S/D metal is preferred. However, a multi-layer structure is usually applied for the source and drain metal. As shown in FIG. 1, a triple-layer 4 consists of a first barrier metal 4a, a major conducting layer 4b (usually Al) and a second barrier metal 4c, such as a Mo/Al/Mo structure. In order to obtain a taper etching profile, the etching rate of the metal layer 4a must be higher than that of Al. Because 4c is usually similar to 4a, it is easy to form an Al overhang structure as shown in FIG. 1, which is not a healthy profile. Furthermore, the channel length is determined by the CD of the layer 4c, which is the CD defined by the photoresist plus the side etch of the Al and layer 4c. As a result, the BCE TFT performance is strongly degraded.

Thus, what is required is a novel method to form the TFT to avoid aforementioned disadvantages of BCE and ES TFT.

SUMMARY OF THE INVENTION

A first object of the present invention is to provide a method of forming a TFT by using a multi-metal S/D structure.

A second object of the present invention is to form a TFT by using two steps of etching including a dry etching and a wet etching to pattern the S/D metal.

A third object of the present invention is to prevent the critical dimensions (CD) loss issue and to reduce the channel region loss problem.

A forth object of the present invention is to form a contact structure between S/D and thereafter formed transparent conducting layer via a via hole in the passivation layer which is formed between said S/D structure and thereafter formed transparent conducting layer.

The present invention includes providing an insulating transparent substrate. A gate such as metal or alloy is patterned on the transparent substrate. Next, a gate isolation layer is formed on the gate electrode for isolation. The gate isolation is composed of silicon oxide or silicon nitride. A semiconductor layer such as amorphous silicon (a-Si) layer is subsequently formed on the gate isolation layer. A n+ doped silicon layer is formed on the upper surface of the a-Si layer. The n+ doped layer can be created by implanting ions into the upper surface of the a-Si layer or by forming a doped silicon layer directly by using plasma chemical vapor deposition (CVD). Then, the a-Si layer and the n+ doped silicon layer are patterned by means of lithography technique.

A first, a second and a third metal layers are successively formed on the n+ doped silicon layer, thereby forming a multi-metal layer structure. The upper metal layer (the third metal layer) is selected from Mo, MoN. The second metal layer is formed by aluminum or aluminum alloy, such as AlNd. The lower metal layer is selected from the group of Cr (chromium), Ti (titanium), Cr alloy, Ti alloy and titanium nitride. A wet etching is used to etch the third metal layer and the second metal layer. Preferably, the etching rate of the third metal layer is higher than that of the second metal layer (aluminum).

Subsequently, a dry etching is utilized to etch the first metal layer and the n+ doped layer, thereby defining the S/D electrodes. Residual n+ doped silicon layer covered by the first metal layer will remain on a portion of the amorphous silicon to act as an ohmic contact layer.

Thereafter, a passivation layer is deposited on the whole surface. Then, patterning is applied to the passivation layer by using a photoresist mask (not shown) and further applying an etching.

An ITO (indium tin oxide) layer is formed by a sputtering technique. Subsequently, patterning is applied to the ITO layer. Finally, the drain electrode is electrically connected to the pixel electrode formed by the ITO layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention will be described in detail with reference to drawings. The present invention is to provide a method of manufacturing TFT by means of BCE structure introducing two steps of etching for S/D metal patterning. A wet etch is involved to etch the third metal layer and the aluminum (Al) layer. A dry etch is used to etch the first metal layer. The first metal layer is selected with the resistant to the wet etchant used to etch the aluminum. The detailed processes will be described as follows.

Figure 1:
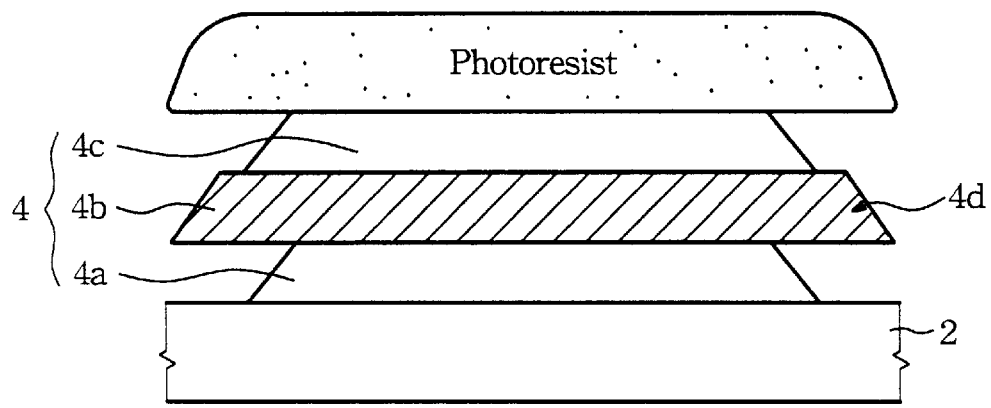
FIGS. 1 is a cross sectional view of a S/D bus metal having overhang portion after a wet etching in accordance with the prior art.
Figure 2:
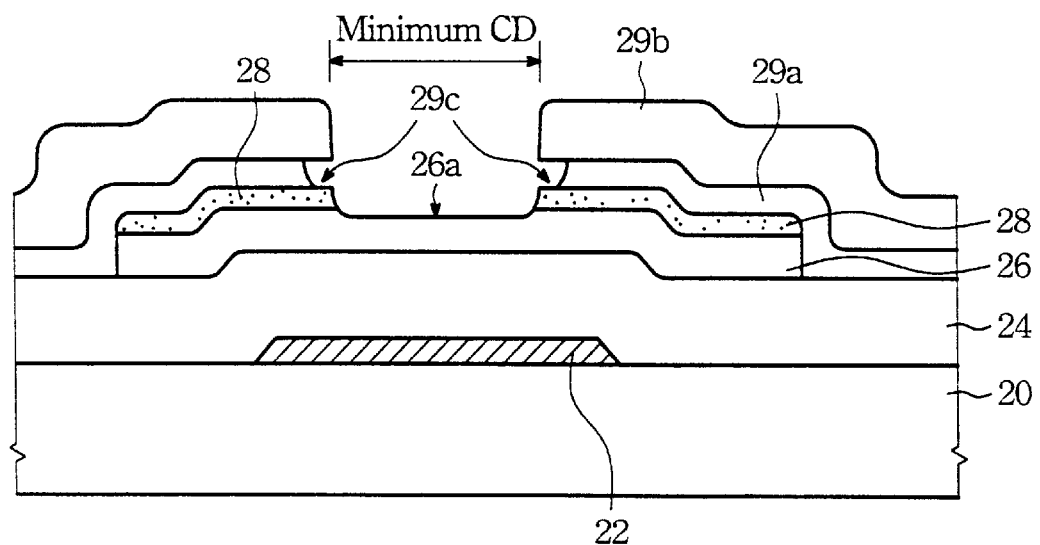
FIG. 2 is a cross sectional view of BCE type TFT in accordance with the prior art.
Figure 3:
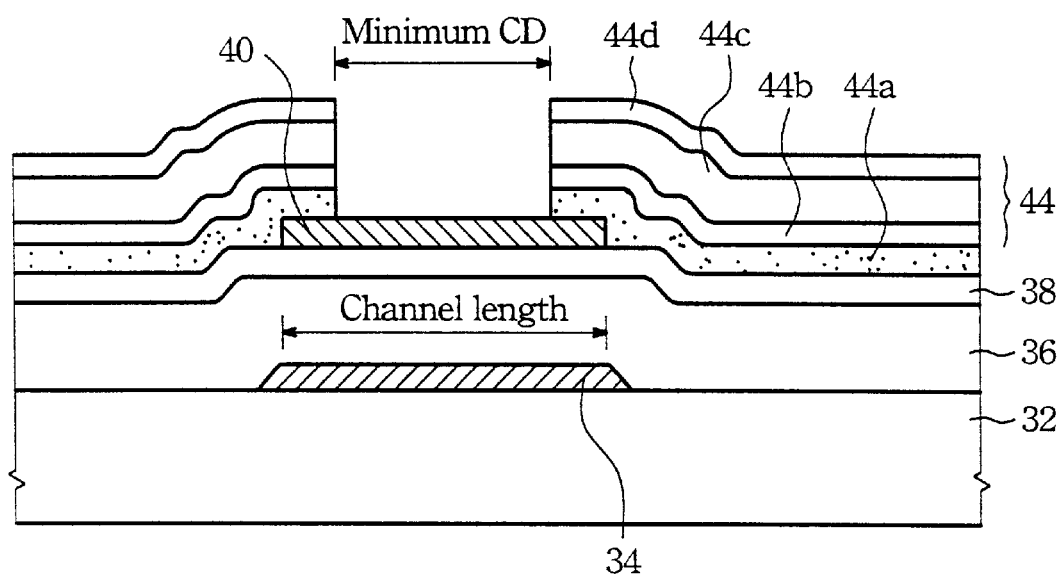
FIG. 3 is a cross sectional view of ES type TFT in accordance with the prior.
Figure 4:
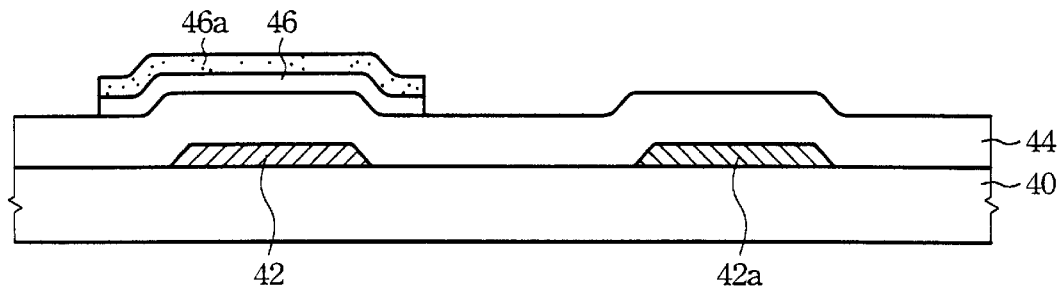
FIG. 4 is a cross sectional view of a TFT illustrating the steps of forming gate electrode, amorphous silicon and doped silicon layer in accordance with the present invention.

Referring to FIG. 4, in the preferred embodiment, a glass substrate 40 or the like is used as an insulating transparent substrate 40. A conductive layer 42 such as metal or alloy is deposited onto the transparent substrate 40, followed by etching the conductive layer 42 with lithography process to form a gate electrode 42. The material used for the gate can be chromium (Cr), tungsten (W), titanium (Ti), tantalum (Ta), molybdenum (Mo), aluminum (Al) or Al alloy. In some case, a multi-gate structure can also be used for the present invention. The material of the multi-gate structure can be selected from above material. The thickness of the conductive layer 42 is typically 1000 to 3000 angstroms. Next, a gate isolation (dielectric) layer 44 is formed on the gate electrode 42 for isolation. The gate isolation is composed of silicon oxide, silicon nitride or the combination of both kinds of material to form a multi-layer structure. The multi-layer structure will improve the dielectric breakdown strength. The isolation layer 44 can be formed by using plasma chemical vapor deposition method. The reaction gases for forming the silicon oxide or nitride layer can be $SiH_4$, $NH_3$, $N_2$, $N_2O$ or $SiH_2Cl_2$, $NH_3$, $N_2$, and $N_2O$.

A semiconductor layer such as amorphous silicon (a-Si) layer 46 is subsequently formed on the gate isolation layer 44. In addition, in some case, the semiconductor layer 46 can be composed of multi-layer structure to improve the film quality and production throughput. In a case, the amorphous silicon layer 46 is about 2000 to 3000 angstroms in thickness. A n+ doped silicon layer 46a is formed on the upper surface of the a-Si layer 46. The n+ doped layer can be created by implanting ions into the upper surface of the a-Si layer 46 or by forming a doped silicon layer, directly. In a case, the doped silicon layer can be directly deposited by using plasma chemical vapor deposition (CVD). Then, the layers including the a-Si layer 46 and the n+ doped silicon layer 46a are patterned over the gate electrode 42 by means of lithography technique. The thickness of the n+ doped silicon layer 46a is about 200 to 500 angstroms.

Figure 5:
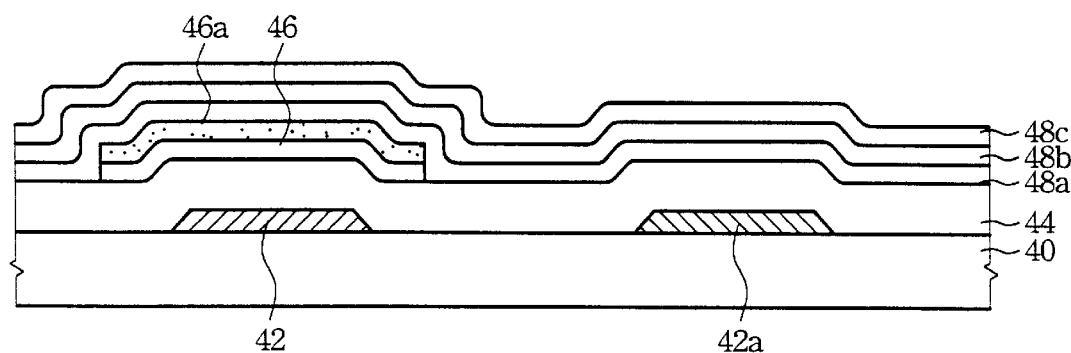
FIG. 5 is a cross sectional view of a TFT illustrating the step of forming a multi-metal structure in accordance with the present invention.

Turning to FIG. 5, a multi-metal structure 48 is formed on the patterned n+ doped silicon layer 46a and on the insulating layer 44. The multi-metal layer herein is referred to the structure constructed by at least three conductive layers. In other words, a first metal layer 48a is formed on the n+ doped silicon layer 46a, followed by forming a second metal layer 48b. Then, a third metal layer 48c is formed on the second metal layer 48b. Typically, the second metal layer 48b is formed by aluminum or aluminum alloy, such as AlNd. The lower metal layer, namely, the first metal layer 48a is selected from the group of Cr (chromium), Ti (titanium), Cr alloy, Ti alloy, chromium nitride and titanium nitride. Preferably, the first metal layer 48a exhibits high etching resistance under the etching of the second metal layer 48b. It acts as the barrier between the aluminum layer 48b and the n+ doped silicon layer 46a.

Figure 6:
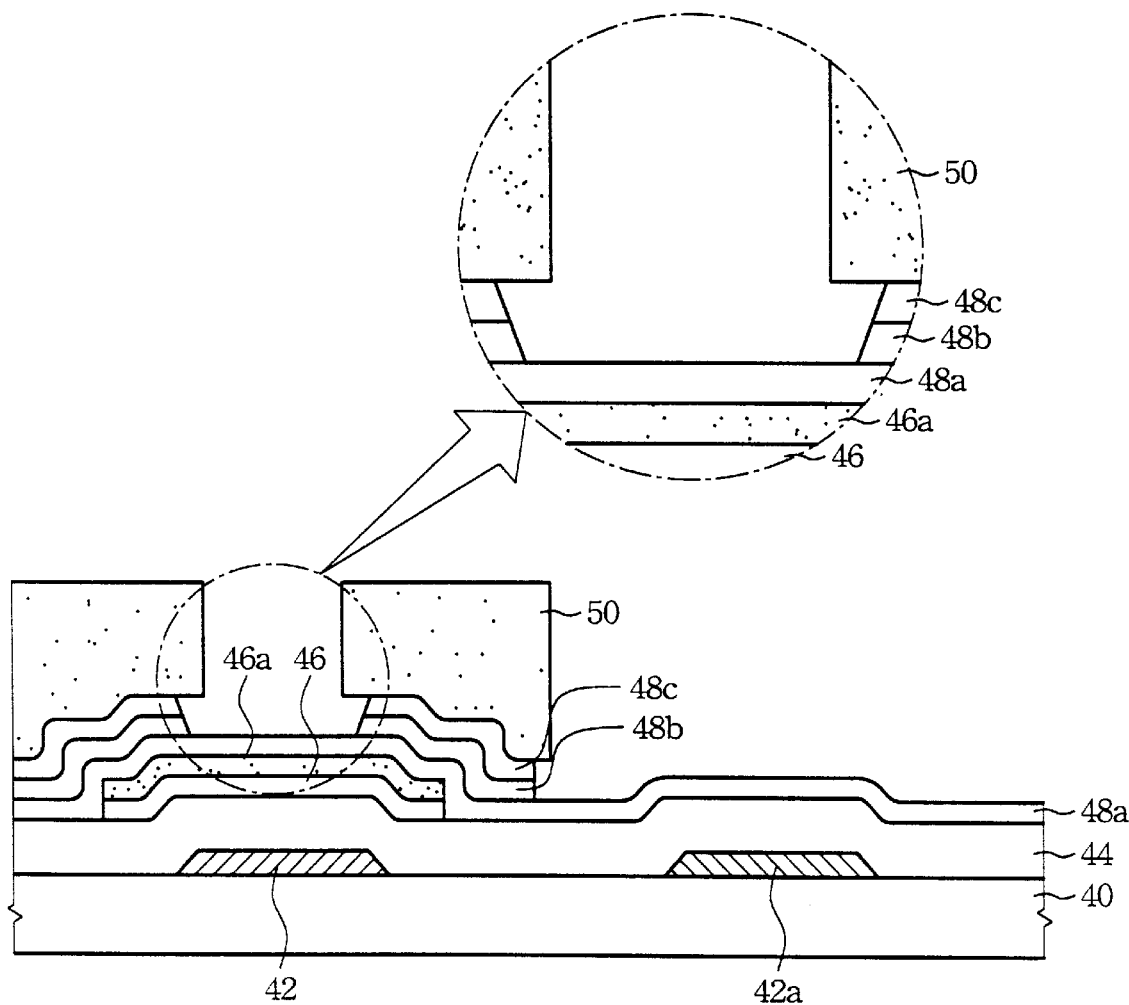
FIG. 6 is a cross sectional view of a TFT illustrating the step of performing a wet etching to etch the third and the second metal layers of the multi-metal structure in accordance with the present invention.

As illustrated in FIG. 6, next stage is to perform the two steps etching. In the first etching step, a wet etching is introduced to etch the third metal layer 48c and the second metal layer 48b using a photoresist 50 as an etching mask. Preferably, the etching rate of the third metal layer 48c is higher than that of the second metal layer (aluminum) 48b. As known in the art, the wet etching is isotropical, therefore the solution for etching will laterally attack these two metal layers 48b and 48c, thereby achieving a taper etching profile. On the contrast, the first metal layer 48a is not etched by the etching solution in this stage. The third metal layer 48c is selected form Mo, MoN or the combination thereof.

Figure 7:
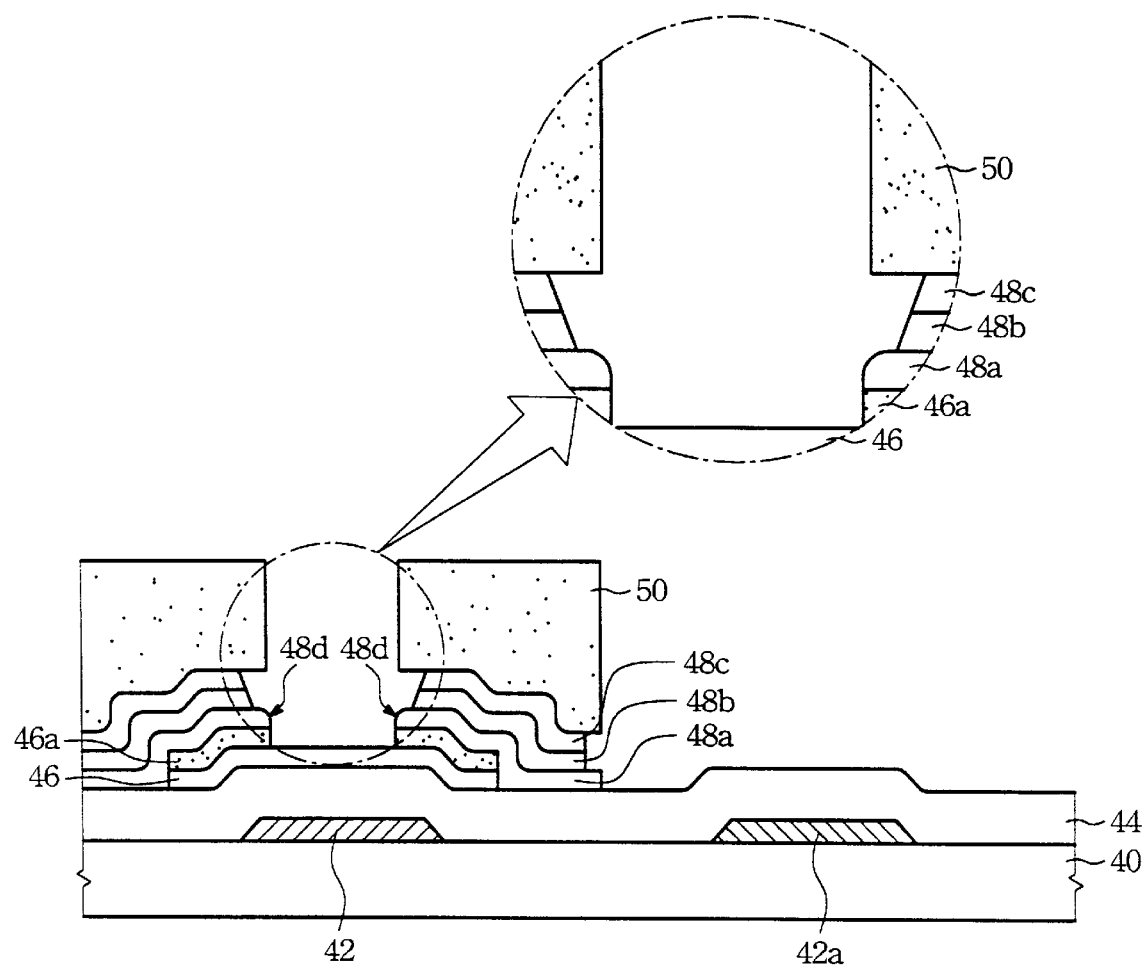
FIG. 7 is a cross sectional view of a TFT illustrating the step of performing a dry etching to etch the first metal layers of the multi-metal structure in accordance with the present invention.

Subsequently, a second etching step is performed, as shown in FIG. 7. In this step, a dry etching is utilized to etch the first metal layer 48a using the same photoresist 50 as the etching mask. The dry etching exhibits the anisotropical etching characteristic, thus the first metal layer 48a has extended portions 48d after the etching. The etching will not stop until the amorphous silicon 46 is exposed, thereby defining the S/D electrodes. Residual n+ doped silicon layer covered by the first metal layer 48a will remain on a portion of the amorphous silicon 46 to act as an ohmic contact layer. In one case, reactive ion etching (RIE) technique can be utilized for the second etching step. Then, the photoresist 50 is stripped away.

Figure 8A:
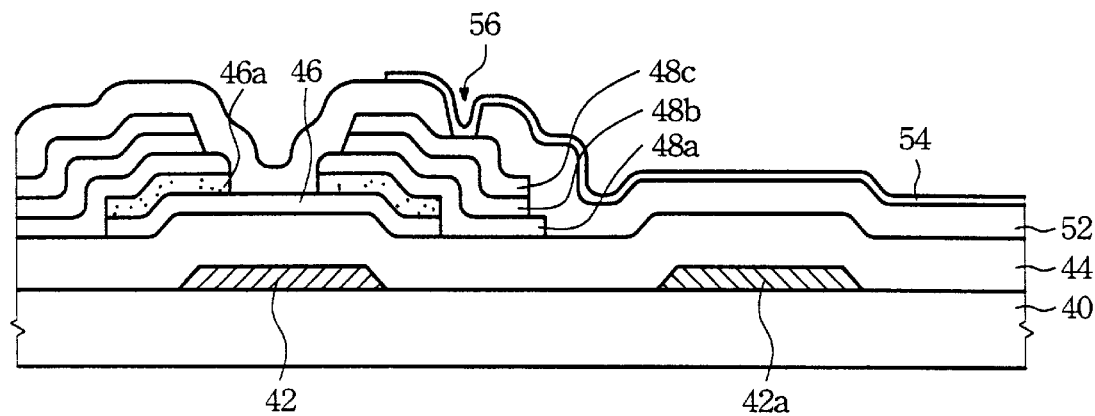
FIG. 8A is a cross sectional view of a TFT illustrating the steps of forming a passivation layer and a ITO layer in accordance with the present invention.

Because a dry etching is used with a photoresist pattern having critical dimension, the critical dimensions (CD) will not lose in the present invention. Further, the thickness of a single first metal layer 48a is similar to the one of the n+ doped silicon layer 46a, thus the over-etching can be easily controlled by time mode to prevent the channel region of the silicon layer 46 from being etched too much. Therefore, the channel region loss in the prior art can be reduced by the present invention. Thus, the present invention can solve the channel loss problem without the ES layer, a taper profile can be obtained by the usage of the wet etching as mentioned above. Alternatively, the ES layer can be used in the present invention, as shown in FIG. 8A. The ES layer 46b is patterned on the amorphous silicon layer 46b prior to the formation of the doped silicon layer 46a.

Thereafter, a passivation layer 52 is deposited on the whole surface by applying a plasma CVD method. Please refer to FIG. 8. A single insulating layer or double insulating layers can form the passivation layer 52. In a preferred embodiment, the passivation layer is composed of silicon nitride, oxide or the like. Then, patterning is applied to the passivation layer 52 by using a photoresist mask (not shown) and further introducing a wet etching using a hydrofluoric acid solution or a dry etching including RIE using a fluorine containing gas such as $CF_4+O_2$ or $BCl_3+Cl_2$. Thus, the passivation layer 52 appears to have a predetermined pattern, a portion of the third conductive layer 48c are exposed, as shown in FIG. 8A. A via hole 56 is also generated in the passivation layer 52.

Figure 8B:
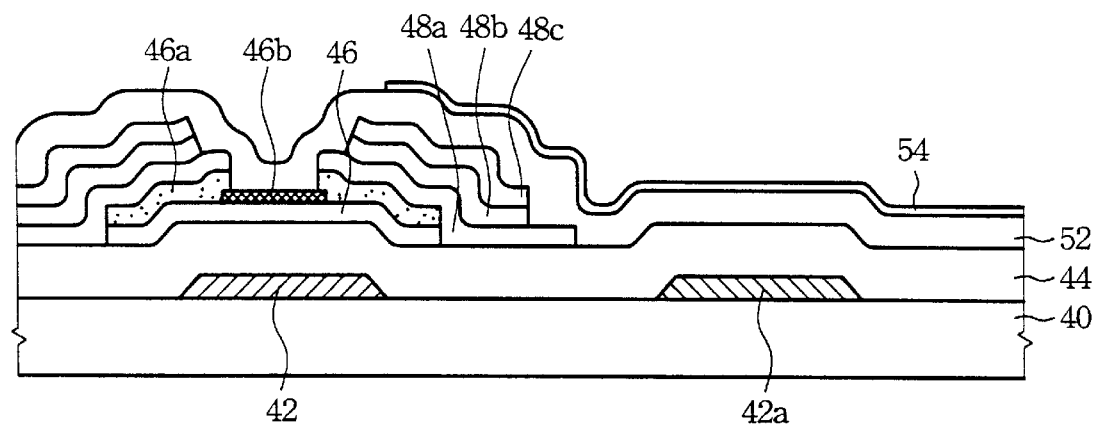
FIGS. 8B–8H are cross sectional views of alternative embodiments in accordance with the present invention.

An ITO (indium tin oxide) layer 54 is formed by a sputtering technique to have a thickness from about 50 to 100 nm in thickness for instance. Subsequently, patterning is applied to the ITO layer via lithography technique. For example, the etchant for etching ITO layer 52 is a mixture solution of HCl and $HNO_3$ or a mixture liquid of HCL and $FeCl_2$. Finally, the drain electrode is electrically connected to the pixel electrode formed by ITO layer 54. The ITO layer 54 contacts the drain electrode by the third metal layer 48c via the via hole 56, as shown in FIG. 8A. The structure can be also used for ES type TFT, as shown in FIG. 8B. In the drawing, an etching stop layer 46b is formed on the amorphous layer 46 before the formation of the doped amorphous layer 46a.

The structure of the present invention can be seen in FIG. 8A and FIG. 8B. The present invention includes a gate electrode 42 formed on a substrate 40. A gate insulating layer 44 is formed on the gate electrode 42 and the substrate 40 for isolation. A semiconductor layer 46 is formed on the gate insulating layer 44. A doped semiconductor layer 46a is then formed on the semiconductor layer 46 as an ohmic contact layer and a drain and source structure consisting of a first conductive layer 48a, a second conductive layer 48b and a third conductive layer 48c. Wherein the first conductive layer 48a is formed on the doped semiconductor layer 46a and the gate insulating layer 44, the second conductive layer 48b lays on the first conductive layer 48a and a third conductive layer 48c is on the second conductive layer 48b, thereby forming a multi-conductive structure. A passivation layer 52 is formed on the source and drain structure. The structure includes an indium tin oxide (ITO) layer 54 is formed on the passivation layer 52. The first conductive layer 48a has extended portions 48d on a portion of a channel region to prevent a critical dimension loss.

Figure 8C:
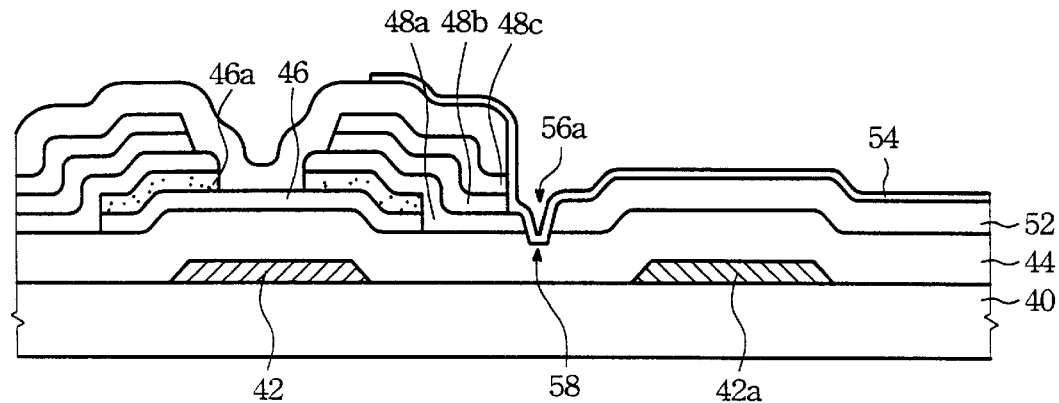
Figure 8D:
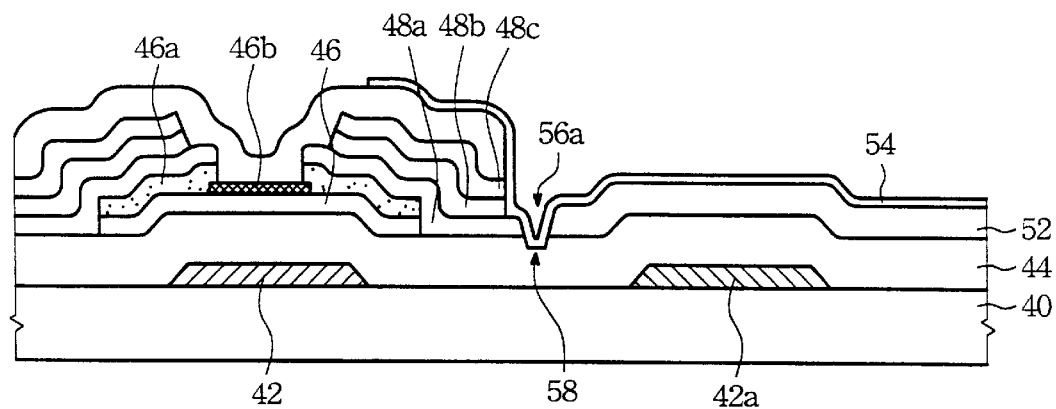

Further, the source/drain structure of the present invention can be formed by two layers. The third and fourth embodiments are illustrated in the FIG. 8C and FIG. 8D. Similarly, the embodiments according to FIG. 8C and FIG. 8D represent the BCE and ES type TFT, respectively. In the figures, the multi-layer conductive structure is composed of a first and a second conductive layers 48a and 48b. The materials for forming these layers are the same with the first or second embodiment. The structure will prevent the critical dimension of the channel from being loss. In addition, the contact between the ITO and the multi-layer conductive structure is different from the three multi-layer structure. During the patterning of the passivation layer 52, the via hole 56a is defined adjacent to the drain consisted of the first conductive layer 48a and the second conductive layer 48b, and at least the side wall of the multi-layer conductive structure is exposed. The feature will provide a benefit for the subsequent side wall contact between the ITO and the drain. A recessed portion 58 may be generated in the passivation layer 52 by over-etching during the formation of the via hole 56a due to the passivation layer 52 and the gate isolation layer 44 may be composed of similar material. In order to prevent the above issue, the passivation layer 52 and the gate isolation 44 can be formed by different material with high etching selectivity between thereof.

Figure 8E:
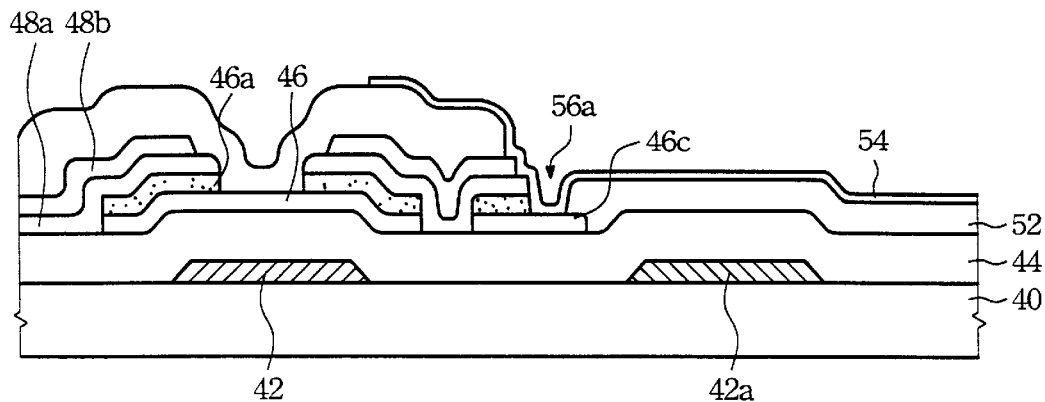
Figure 8F:
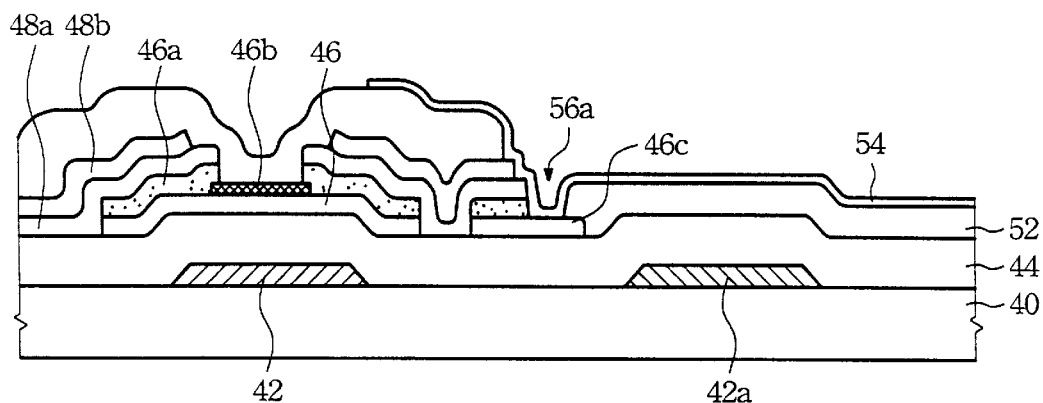
Figure 8G:
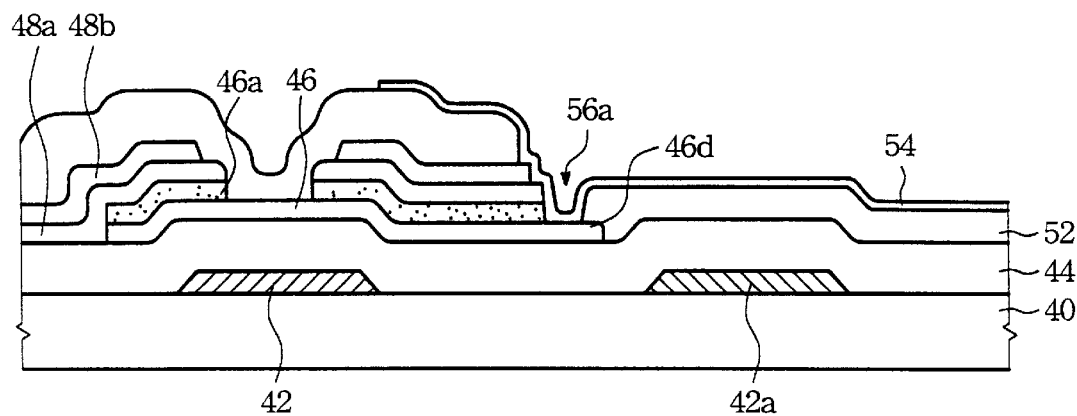
Figure 8H:
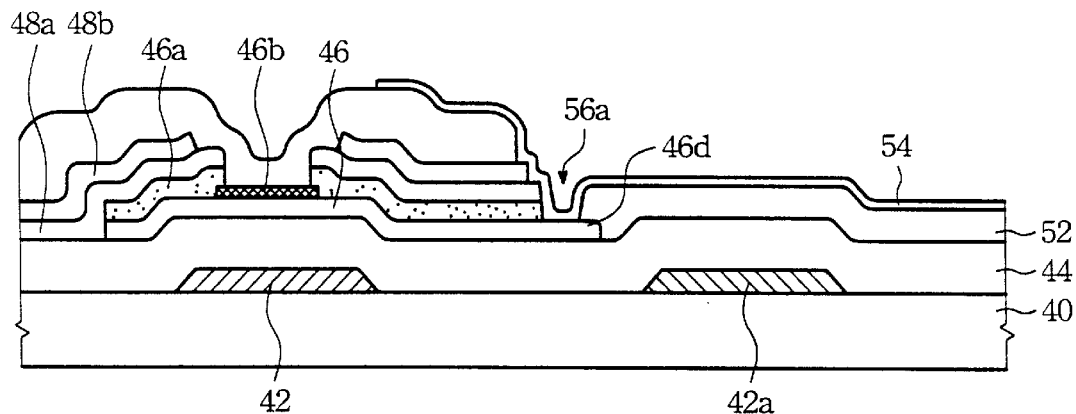

Alternatively, the via hole 56a can be formed by using other method to prevent the gate isolation layer 44 from being etched. The FIG. 8E to FIG. 8H show the improved methods to overcome the above issue. Both of the methods can be applied to BCE or ES type TFT. The fifth and sixth embodiments are shown in FIG. 8E and 8F. The major step is to create a contact pad 46c to act as an etching barrier during the pattern of the amorphous layer 46. The contact pad 46c is defined adjacent to the channel region and separated from the channel in cross sectional view. A portion of the contact pad 46c has to be exposed during the patterning of the via hole 56a in the passivation layer to provide a area for contacting to the subsequent ITO layer. Before forming the via hole, the source and drain structure is defined by using aforesaid method. Subsequent step is to form a passivation layer 52 thereon. The via hole 56a is then created in the passivation layer and aligned to the contact pad 46c, thereby exposing the contact pad 46c. The contact pad 46c acts as an etching stop layer, therefore, the embodiments can prevent the recessed portion 58 from being formed in the passivation layer.

The alternative example is to form an extended portion 46d of the amorphous layer 46 instead of separating the amorphous layer 46 into the channel region and the contact pad during the patterning of the amorphous layer 46. The extended portion 46d extends to the area for forming the via holes 56a to acts as the etching barrier. The other steps are similar to the aforesaid methods. The detailed description is omitted. Certainly, the method can be applied to BCE or ES type structure.

As described above, the present invention uses two steps of etching to etch the S/D electrode, and an novel S/D multi-conductive layer structure corresponding to the etchings. As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structures. Thus, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A structure of a thin film transistor (TFT), said structure comprising:
   a gate electrode formed on a substrate;
   a gate insulating layer formed on said gate electrode and said substrate for isolation;
   a semiconductor layer formed on said gate insulating layer;
   a doped semiconductor layer formed on said semiconductor layer as an ohmic contact layer; and
   a drain and source structure including a first conductive layer, a second conductive layer and a third conductive layer, wherein said first conductive layer is formed on said doped semiconductor layer and said gate insulating layer, said second conductive layer being on said first conductive layer and a third conductive layer being on said second conductive layer, thereby forming a multi-conductive layer structure, wherein said first conductive layer has rims uncovered by said second and third conductive layers to prevent a critical dimension loss and provide a contact structure with conducting layer formed thereafter.

2. The structure of claim 1, further comprising a passivation layer formed on said source and drain structure.

3. The structure of claim 1, further comprising a transparent conducting layer formed on said passivation layer, wherein said transparent conducting layer contacts said third conductive layer via a via hole in said passivation layer.

4. The structure of claim 1, further comprising transparent conducting layer formed on said passivation layer, wherein said transparent conducting layer contacts rims and sides of said multi-conductive layer structure via a via hole in said passivation layer.

5. The structure of claim 1, wherein said first conductive layer is selected from Cr (chromium), Ti (titanium), Cr alloy, Ti alloy, titanium nitride, chromium nitride.

6. The structure of claim 1, wherein said second conductive layer is selected from aluminum or aluminum alloy.

7. The structure of claim 1, wherein said third conductive layer is selected from Mo, MoN and the combination thereof.

8. The structure of claim 1, further comprising an etching stop layer formed on said semiconductor layer.

9. A structure of a thin film transistor (TFT), said structure comprising:
   a gate electrode formed on a substrate;
   a gate insulating layer formed on said gate electrode and said substrate for isolation;
   a semiconductor layer formed on said gate insulating layer;
   a doped semiconductor layer formed on said semiconductor layer as an ohmic contact layer; and
   a drain and source structure including a first conductive layer and a second conductive layer, wherein said first conductive layer is formed on said doped semiconductor layer and said gate insulating layer, said second conductive layer being on said first conductive layer, thereby forming a multi-conductive layer structure, wherein said first conductive layer has rims uncovered by said second conductive layer to prevent a critical dimension loss and provide a contact structure with conducting layer formed thereafter.

10. The structure of claim 9, further comprising a passivation layer formed on said source and drain structure, wherein said passivation layer has a via hole formed adjacent to said multi-conductive layer structure.

11. The structure of claim 9, further comprising a transparent conducting layer formed on said passivation layer, wherein said transparent conducting layer contacts rims and sides of said multi-conductive layer structure via said via hole.

12. The structure of claim 9, wherein said first conductive layer is selected from Cr (chromium), Ti (titanium), Cr alloy, Ti alloy, titanium nitride, chromium nitride.

13. The structure of claim 9, wherein said second conductive layer is selected from aluminum or aluminum alloy.

14. The structure of claim 9, further comprising an etching stop layer formed on said semiconductor layer.

15. A structure of a thin film transistor (TFT), said structure comprising:
   a gate electrode formed on a substrate;
   a gate insulating layer formed on said gate electrode and said substrate for isolation;
   a semiconductor layer formed on said gate insulating layer;
   a contact pad formed adjacent to said semiconductor layer;
   a doped semiconductor layer formed on said semiconductor layer as an ohmic contact layer; and
   a drain and source structure including a first conductive layer and a second conductive layer, wherein said first conductive layer is formed on said doped semiconductor layer and said gate insulating layer, said second conductive layer being on said first conductive layer, thereby forming a multi-conductive layer structure, wherein said first conductive layer has rims uncovered by said second conductive layer to prevent a critical dimension loss and provide a contact structure with conducting layer formed thereafter.

16. The structure of claim 15, further comprising a passivation layer formed on said source and drain structure, wherein said passivation layer has a via hole formed adjacent to said multi-conductive layer structure and said via hole being aligned to said contact pad.

17. The structure of claim 15, further comprising a transparent conducting layer formed on said passivation layer, wherein said transparent conducting layer contacts rims and sides of said multi-conductive layer structure via said via hole.

18. The structure of claim 15, wherein said first conductive layer is selected from Cr (chromium), Ti (titanium), Cr alloy, Ti alloy, titanium nitride, chromium nitride.

19. The structure of claim 15, wherein said second conductive layer is selected from aluminum or aluminum alloy.

20. The structure of claim 15, further comprising an etching stop layer formed on said semiconductor layer.

21. A structure of a thin film transistor (TFT), said structure comprising:

a gate electrode formed on a substrate;

a gate insulating layer formed on said gate electrode and said substrate for isolation;

a semiconductor layer formed on said gate insulating layer to act a channel region, wherein said channel region has an extended portion extending to a via hole area;

a doped semiconductor layer formed on said semiconductor layer as an ohmic contact layer; and a drain and source structure including a first conductive layer and a second conductive layer, wherein said first conductive layer is formed on said doped semiconductor layer and said gate insulating layer, said second conductive layer being on said first conductive layer, thereby forming a multi-conductive layer structure, wherein said first conductive layer has rims uncovered by said second conducting layer to prevent a critical dimension loss and provide a contact structure with conducting layer formed thereafter.

22. The structure of claim 21, further comprising a passivation layer formed on said source and drain structure, wherein said passivation layer has a via hole formed adjacent to said multi-conductive layer structure and said via hole being aligned to said extended portion of said channel region.

23. The structure of claim 21, further comprising a transparent conducting layer formed on said passivation layer, wherein said transparent conducting layer contacts rims and sides of said multi-conductive layer structure via said via hole.

24. The structure of claim 21, wherein said first conductive layer is selected from Cr (chromium), Ti (titanium), Cr alloy, Ti alloy, titanium nitride, chromium nitride.

25. The structure of claim 21, wherein said second conductive layer is selected from aluminum or aluminum alloy.

26. The structure of claim 21, further comprising an etching stop layer formed on said semiconductor layer.

* * * * *